United States Patent [19]
Kim

[11] Patent Number: 6,103,626
[45] Date of Patent: *Aug. 15, 2000

[54] METHOD FOR FORMING DUMMY PATTERN AREAS IN A SEMICONDUCTOR DEVICE

[75] Inventor: Won Chul Kim, Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/064,128

[22] Filed: Apr. 22, 1998

[30] Foreign Application Priority Data

Apr. 22, 1997 [KR] Rep. of Korea ...................... 97-15007

[51] Int. Cl.[7] .......................... H01L 21/302; H01L 23/52
[52] U.S. Cl. .......................... 438/691; 438/692; 257/758; 257/760
[58] Field of Search ..................................... 438/691, 692; 257/618, 620, 758, 760

[56] References Cited

U.S. PATENT DOCUMENTS

| | | | |
|---|---|---|---|
| 5,220,199 | 6/1993 | Owada et al. | 257/773 |
| 5,289,422 | 2/1994 | Mametani | 365/210 |
| 5,357,140 | 10/1994 | Kosasa | 257/752 |
| 5,430,325 | 7/1995 | Sawada et al. | 257/618 |
| 5,459,093 | 10/1995 | Kuroda et al. | 437/51 |
| 5,529,954 | 6/1996 | Iijima et al. | 438/653 |
| 5,556,805 | 9/1996 | Tanizawa et al. | 438/637 |
| 5,652,465 | 7/1997 | Hosoda et al. | 257/759 |

*Primary Examiner*—Benjamin L. Utech
*Assistant Examiner*—Kin-Chan Chen
*Attorney, Agent, or Firm*—Myers Bigel Sibley & Sajovec

[57] ABSTRACT

A method is provided for forming a dummy pattern in a semiconductor device. The dummy pattern areas are formed only in some areas of the substrate in which conductive layer pattern areas are not formed. In particular, the distances by which the dummy pattern areas are separated from the conductive layer pattern areas are determined by controlling the magnitude by which the conductive layer pattern areas are enlarged during the process of defining the dummy pattern area on the substrate. Widths of dummy pattern areas can also be predetermined. Dummy pattern areas may be selectively formed in a substrate by combining the dummy pattern areas where adjacent portions of dummy pattern areas are less than a predetermined distance from each other and additional dummy pattern areas may be formed adjacent to dummy pattern areas vulnerable to over-etching. Accordingly, it is possible to reduce damage to the conductive layer pattern areas during over-etching and CMP process and to reduce the parasitic capacitance between the conductive layer pattern areas and underlying conductive layer pattern areas. Leakage current and the possibility of misoperation of the semiconductor device are thus reduced.

11 Claims, 8 Drawing Sheets

METHOD FOR FORMING DUMMY PATTERN AREAS IN A SEMICONDUCTOR DEVICE

BACKGROUND OF THE INVENTION

1. Field of the Invention

The present invention relates to a method for manufacturing a semiconductor device, and more particularly to a method for forming dummy pattern areas.

2. Description of the Related Art

Semiconductor devices are being made multi-layered in order to achieve a higher integration in a restricted area. Accordingly, as the integration degree of the semiconductor device becomes higher, a step difference becomes higher between a portion on which pattern areas are integrated and a portion on which pattern areas are isolated.

It is necessary to reduce the thickness of the pattern when a specific pattern is formed on an optional material layer in order to minimize the step difference. For this, the surface of a lower layer on which the pattern is formed is entirely flattened. The surface must be flattened to thin the pattern and to prevent the reduction of an over-etching margin according to the reduction of a design rule. For flattening the surface, a conventional technology provides a method for forming dummy pattern areas, i.e., conductor pattern areas which are not part of the operating circuits, on a wafer. The dummy pattern areas are formed in areas of a wafer in which the density of the pattern is relatively lower or in which no pattern is formed.

Methods for forming a dummy pattern areas according to the conventional technology is described with reference to attached FIGS. 1–5. With reference to FIG. 1, dummy pattern areas 14 are formed in an area on a substrate 10 in which conductive layer pattern areas 12a, 12b, and 12c are not formed, in the case that the conductive layer pattern areas 12a, 12b, and 12c on the substrate 10 pass over a lattice such as a gate array. The dummy pattern areas 14 are formed in the entire area so as to be aligned with a lattice.

According to this method, as shown in FIG. 4, a parasitic capacitor 30 is formed between a dummy pattern area 29 and an underlying conductive layer pattern area 26 in a lower layer, since an upper interlayer dielectric film 27 between the dummy pattern area 29 and the conductive layer pattern area 26 acts as a dielectric. Thus, the semiconductor device may misoperate. Another problem with this method is that it is hard to apply when the pattern of an underlying film is not regularly aligned.

With reference to FIG. 2, dummy pattern areas 18 are formed in the entire area in which conductive layer pattern areas 17a, 17b, and 17c on a substrate 16 are not formed. The dummy pattern areas 18 are not aligned in a lattice, but are formed as single bodies. A disadvantage of this method is that stress is concentrated on the dummy pattern area 18 since the dummy pattern area 18 is wider than the conductive layer pattern areas 17a, 17b, and 17c. As a result, cracks may be generated in the dummy pattern area 18 or in a conductive line formed below the dummy pattern 18. Further, as shown in FIG. 5, an upper interlayer dielectric film 27 between a wide dummy pattern area 31 and an underlying conductive layer pattern area 26 acts as a dielectric. Accordingly, a parasitic capacitor 32 between dummy pattern 31 and the conductive layer pattern 26 is formed and the semiconductor device may misoperate. In FIGS. 4 and 5, reference numeral 28 denotes a conductive layer pattern area and reference numeral 25 denotes a lower interlayer dielectric film.

Referring to FIG. 3, wide areas exist between the conductive layer pattern areas 21a, 21b, and 21c formed on the substrate 20. The bar-type dummy pattern area 22 is formed in the wide areas between the conductive layer pattern areas 21a, 21b, and 21c. A problem with this structure is that the semiconductor device may misoperate since a number of the parasitic capacitors are formed between the dummy pattern area 22 and conductive lines below.

SUMMARY OF THE INVENTION

It is an object of the present invention to provide a method for forming a dummy pattern area in a semiconductor device in order to prevent a conductive line from being damaged due to over-etching and to minimize formation of parasitic capacitors with underlying conductive lines.

It is another object of the present invention to provide a method for forming a dummy pattern area in a semiconductor device in which stress concentrated on the dummy pattern area is substantially prevented.

It is also an object of the present invention to provide a method for forming a dummy pattern area in a semiconductor device in which parasitic capacitance between conductive layers adjacent the dummy pattern area is minimized.

To achieve the above objects, there is provided a method for forming a dummy pattern area comprising the steps of: (a) defining a dummy pattern boundary area in a substrate; (b) defining a first area and a second area within the dummy pattern boundary area, wherein the second area is defined to be separated from the first area by a first predetermined distance; (c) defining a first pattern group area and a second pattern group area separated from each other by a second pre-determined distance within the first area, and defining a third conductive layer pattern area in the second area; (d) defining first, second and third dummy pattern areas, each having a width of a pre-determined magnitude and being separated by a distance of a first magnitude around said first and second pattern group areas and the third conductive layer pattern area, around the above areas, respectively; and (e) forming first through third conductive layer pattern areas and the first through third dummy pattern areas in each corresponding area on the substrate.

In another embodiment, the step (d) further comprises the steps of: defining third through fifth areas around the first pattern group area, the second pattern group area and the third conductive layer pattern area; defining sixth through eighth areas around the first pattern group area, the second pattern group area and the third conductive layer pattern area, respectively, and defining first through third dummy pattern areas which are obtained by subtracting the third through fifth areas from the sixth through eighth areas, respectively, and subtracting areas which are outside the dummy pattern boundary area. The first and second pattern group areas are, respectively, formed of first conductive layer pattern areas and a second conductive layer pattern. The first through third conductive layer pattern areas are enlarged by the first magnitude to define the third through fifth areas.

According to another embodiment of the present invention, portions where the distance between the enlarged areas is less than one-half of the first magnitude are combined. Also, when an enlargement is performed to define the sixth through eighth areas, portions where the distance between the enlarged areas is less than one-half of a minimum width between the conductive layer pattern areas are combined.

In still another embodiment of the present invention, the first magnitude is preferably about 1.5 to 2 times the minimum distance between the conductive layer pattern areas.

By employing the method for forming a dummy pattern in a semiconductor device according to the present invention, it is possible to selectively form dummy pattern areas in a desired area on the substrate. Therefore, it is possible to minimize the overlap between the wiring on an underlying layer and the dummy pattern areas, thus minimizing the parasitic capacitance between the underlayer wiring and the dummy pattern. As a result, it is possible to prevent stress from being concentrated on the dummy pattern and to minimize leakage current due to the parasitic capacitance to thus prevent the misoperation of the semiconductor device. Such misoperation is further prevented by desirably controlling the distance between the area in which a conductive line is formed and the dummy pattern, and the width of the dummy pattern. Accordingly, it is possible safely carry out etching without damaging the wiring. Also, in a Chemical Mechanical Polishing (CMP) process the wiring will not be damaged.

BRIEF DESCRIPTION OF THE DRAWINGS

The above objects and advantages of the present invention will become apparent by reference to the following detailed description of preferred embodiments thereof with reference to the attached drawings in which.

DESCRIPTION OF THE PREFERRED EMBODIMENTS

First, a method for forming a dummy pattern area of a semiconductor device according to a first embodiment of the present invention will be described.

Figure 1:
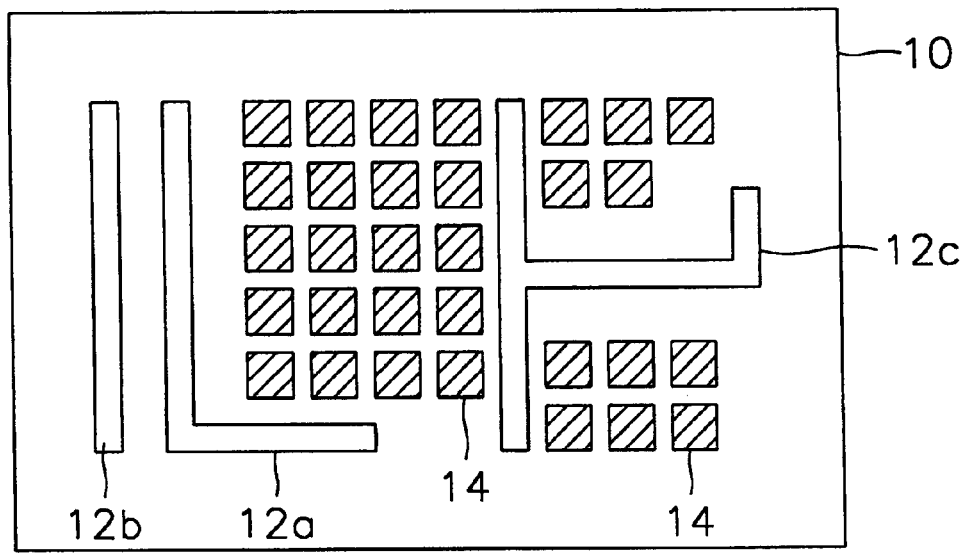
FIGS. 1 through 3 are layout diagrams showing dummy pattern areas formed by a conventional method.
Figure 2:
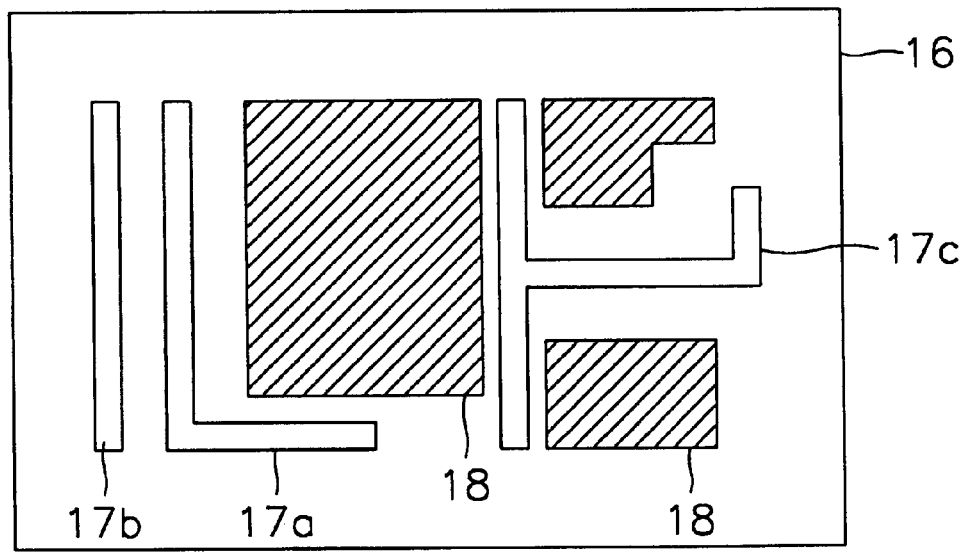
Figure 3:
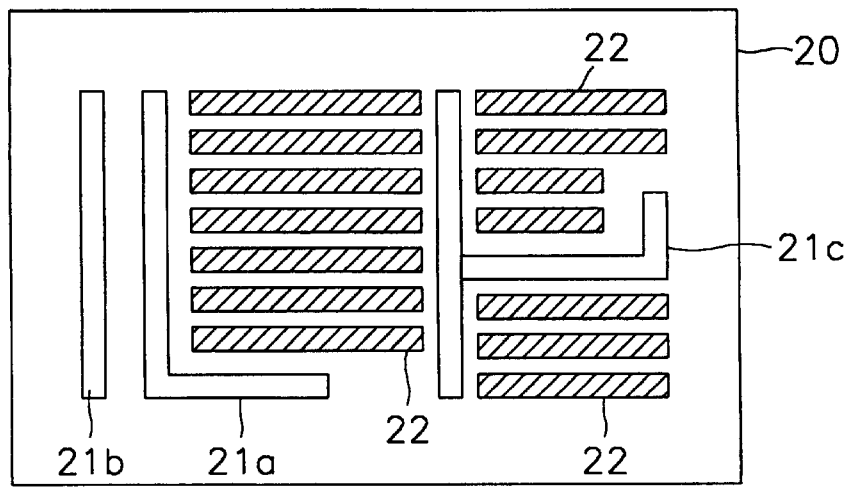
Figure 4:
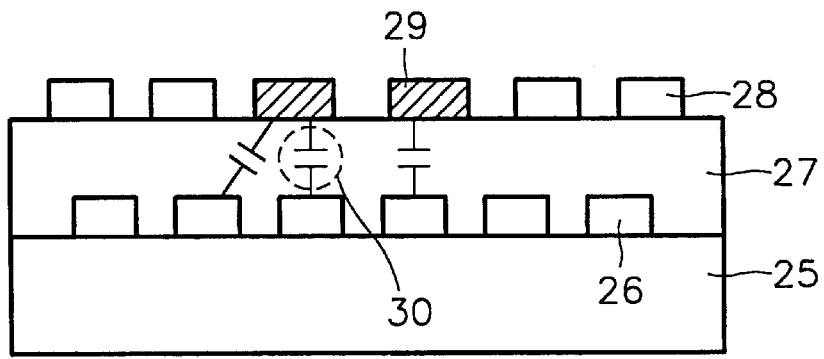
FIGS. 4 and 5 are sectional views showing formation of the parasitic capacitor resulting from forming dummy pattern areas by the conventional method.
Figure 5:
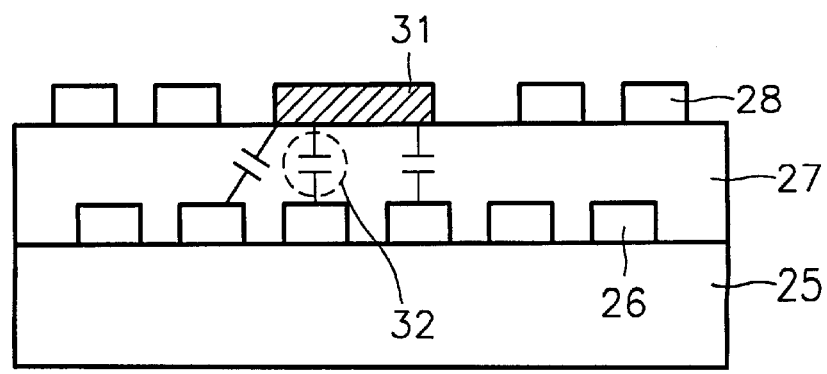
Figure 6:
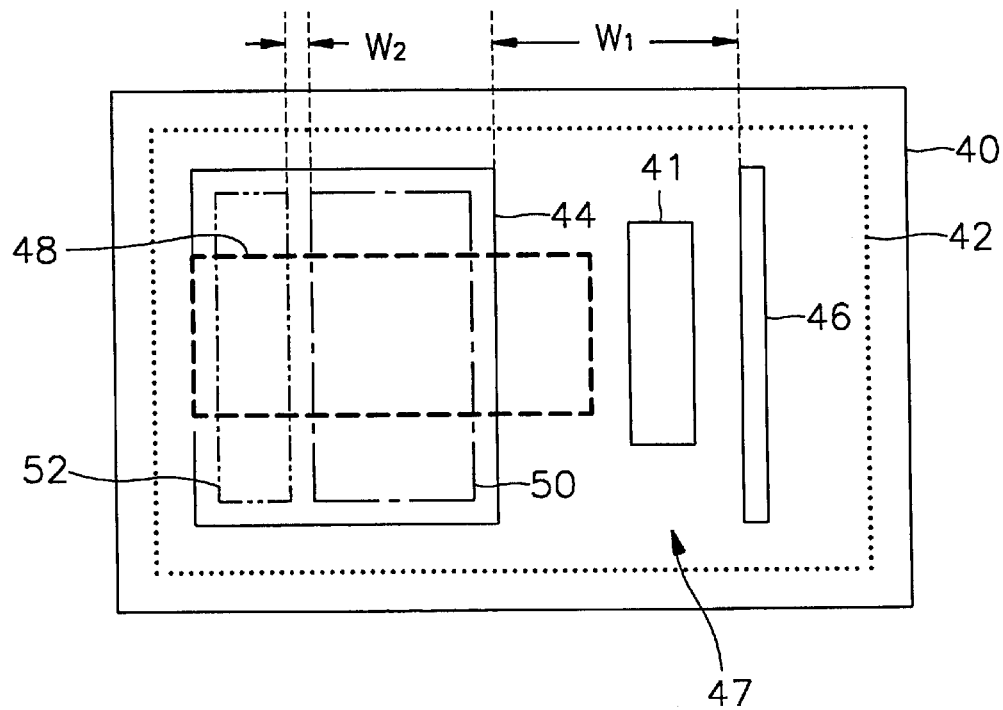
FIGS. 6 through 10 illustrate a method for forming a dummy pattern in a semiconductor device according to a first embodiment of the present invention.

FIG. 6 shows steps of defining first and second conductive layer pattern areas 44 and 46 in which a conductive layer pattern area is to be formed, and an area in which a dummy pattern area 41 is to be formed, all within a predetermined area of a substrate 40. To be specific, an area in which the dummy pattern area 41 can be formed is within a dummy pattern boundary area 42 defined in a predetermined area of the substrate 40.

The dummy pattern area 41 can be formed anywhere in the area defined as the dummy pattern boundary area 42, except for the area in which a conductive layer pattern area is to be formed. The dummy pattern area 41 of FIG. 6 is a nominal illustration of a pattern in a permitted area. Further forms of the dummy pattern area will be more specifically described below.

The dummy pattern boundary area 42 is defined as the area in which conductive layer pattern area are to be formed and the area in which dummy pattern area 41 is to be formed. At this point, an isolated conductive layer pattern area, e.g., area 44, is separately defined in the dummy pattern boundary area 42 in order to prevent an isolated pattern from being damaged due to an over-etching. To be specific, an area of the dummy pattern boundary area 42 is defined as a first area 44, and a second area 46 is defined in a position separated from the first area 44 by a predetermined distance w1. The density of the conductive layer pattern is high in the first area 44 and low in the second area 46. A dummy pattern area 47 is within the dummy pattern boundary area 42 and excludes conductive layer pattern areas.

The first area 44 is divided into a first pattern group area 50, and a second pattern group area 52 separated from the first pattern group area 50 by a predetermined distance w2. The distance w2 by which the first and second pattern group areas 50 and 52 are separated is shorter than that distance w1 by which the first area 44 and the second area 46 are separated. The conductive layer pattern areas, e.g., 57 in FIG. 7, in the first pattern group area 50, the second pattern group area 52, and the second area 46 are defined according to a predetermined design rule. In FIG. 6, the area denoted by reference numeral 48 is an underlying or lower circuit area. Though only one lower circuit area 48 is shown in FIG. 6, additional lower circuit areas may exist.

Figure 7:
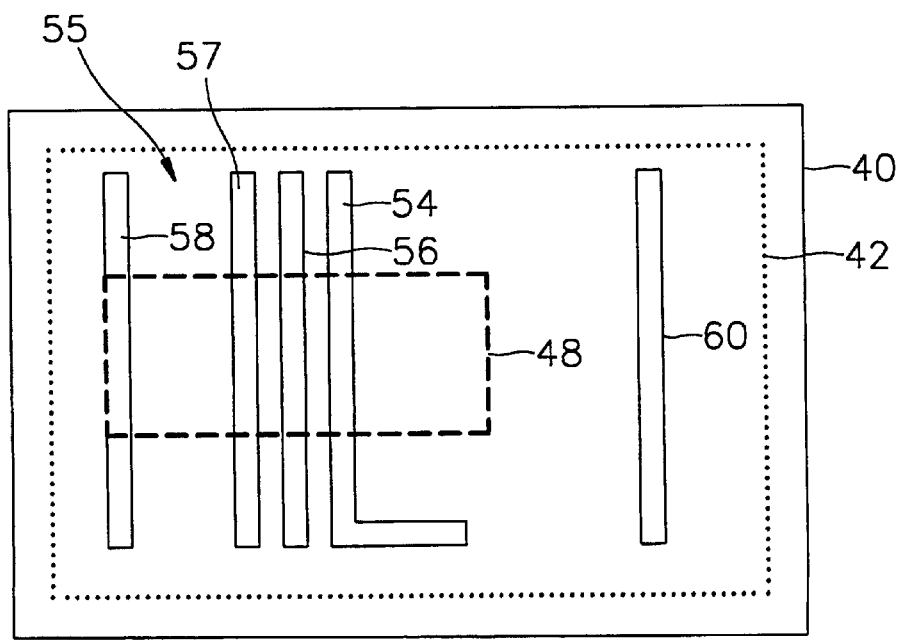

Referring to FIG. 7, first conductive layer pattern areas 54, 56, and 57, a second conductive layer pattern area 58 and a third conductive layer pattern area 60 are defined in areas corresponding, respectively, to the first pattern group 50 and the second pattern group 52, which are in the first area 44 and the second area 46. Though a plurality of conductive layer pattern areas can be defined in the second pattern group area 52, like in the first pattern group area 50, only one conductive layer pattern area, namely, a second conductive layer pattern area 58, is defined in this example. For convenience, conductive layer pattern areas will be referred to generally as conductive pattern areas, meaning one or more conductive layer pattern areas.

The first conductive layer pattern areas 54, 56, and 57 can take various forms, for example, the first conductive layer pattern areas 54, 56, and 57 can alternatively be non-straight line forms such as an L shape like the conductive layer pattern area 54.

In a memory device, the first area 44 may correspond to a cell area and the second area 46 may correspond to a peripheral circuit area.

If there is no conductive layer pattern area in the area 55 outside the first area 44 and the second area 46 in the dummy pattern boundary area 42, a step difference is generated between the areas. This is due to the difference in the densities of the conductive layer pattern areas. Also, the width of the conductive layer pattern areas becomes non-uniform due to a loading effect when each conductive layer pattern area is etched. Therefore, an excellent flatness is obtained during the following flattening process by forming the dummy pattern 41 in the areas other than the first and second areas 44 and 46 within the dummy pattern boundary area 42. When the conductive layer pattern area is formed on the flattened surface, it is possible to form a thinner conductive layer pattern and to secure a sufficient over-etching margin.

However, the area in which a dummy pattern area 47 overlaps the lower circuit area 48 previously formed on the underlying layer becomes wider, in the case of defining the dummy pattern area to be the entire area between the first and second areas 44 and 46. Accordingly, parasitic capacitors exist between the dummy pattern areas and the conductive layer pattern areas consisting of the lower circuit area 48. To prevent this, the area occupied by the dummy pattern area 41 must be minimized. Therefore, it is preferable that the dummy pattern area 47 is defined only in the areas separated from the first pattern group area 50, the second pattern group area 52, and the second area 46 within the dummy pattern boundary area 42 in the substrate 40.

To prevent the conductive layer pattern area from being damaged during over-etching, it is important that the distance by which the first pattern group area 50, the second pattern group area 52 and the second area 46 are separated from the dummy pattern area 47 is appropriately maintained.

Figure 8:
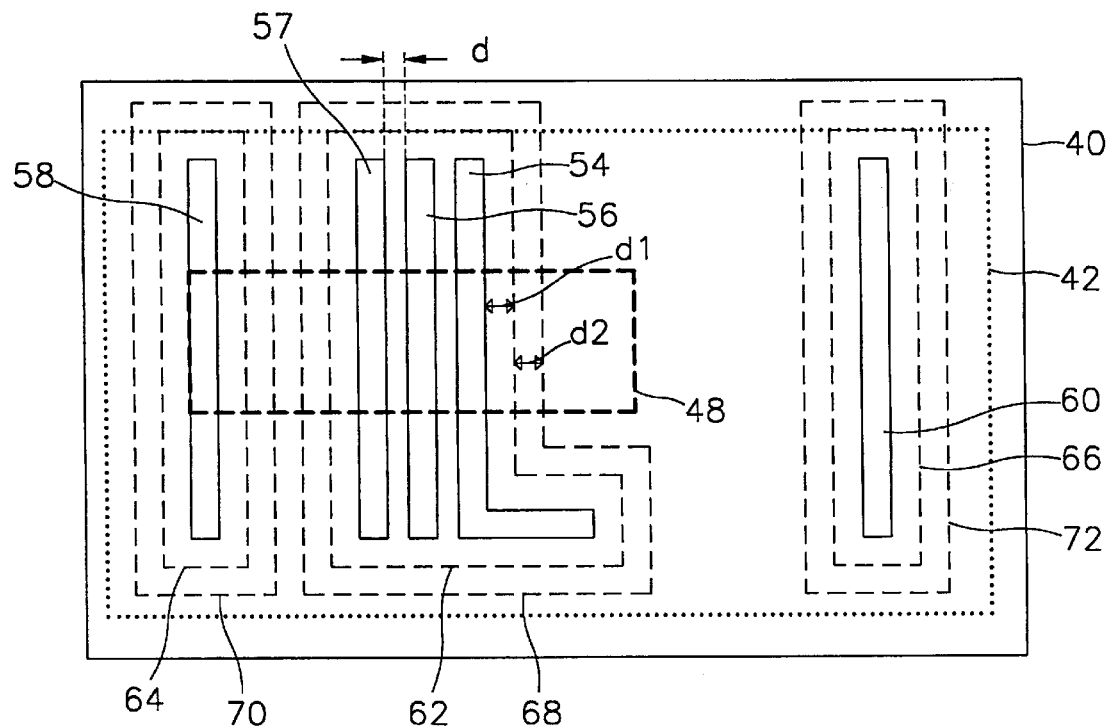

FIG. 8 shows the steps of defining third through eighth areas 62, 64, 66, 68, 70, and 72. The first conductive layer pattern areas 54, 56, and 57, the second conductive layer pattern area 58, and the third conductive layer pattern area 60 are enlarged a first time. As a result, the third area 62 by which the areas 54, 56, and 57 are enlarged by the first enlargement is defined, the fourth pattern area 64 which includes the second area 58 as enlarged by the first enlargement is defined, and the fifth area 66 including the third area 60 as enlarged by the first enlargement is defined.

In the first enlargement, the first through third conductive layer pattern areas 54, 56, 57, 58 and 60 are each enlarged by a first magnitude d1. The first magnitude (d1) is larger than one-half of the distance d between the first conductive layer pattern areas 54, 56, and 57. Distance d is a selected minimum distance between pattern areas, also known as the design rule. The third area 62 is formed to surround the first conductive layer pattern areas 54, 56, and 57. This is because the first enlargement areas of the first areas 54, 56, and 57 overlap each other. Here, the first magnitude d1 corresponds to the distance between a conductive layer pattern area and a dummy pattern area to be formed. Therefore, it is possible to uniformly maintain the etch bias of the areas corresponding to the first through third conductive layer pattern areas 54, 56, 57, 58 and 60 during the over-etching process by appropriately controlling the first magnitude d1. The first magnitude d1 is preferably about 1.5 times to 2.0 times the design rule.

Figure 9:
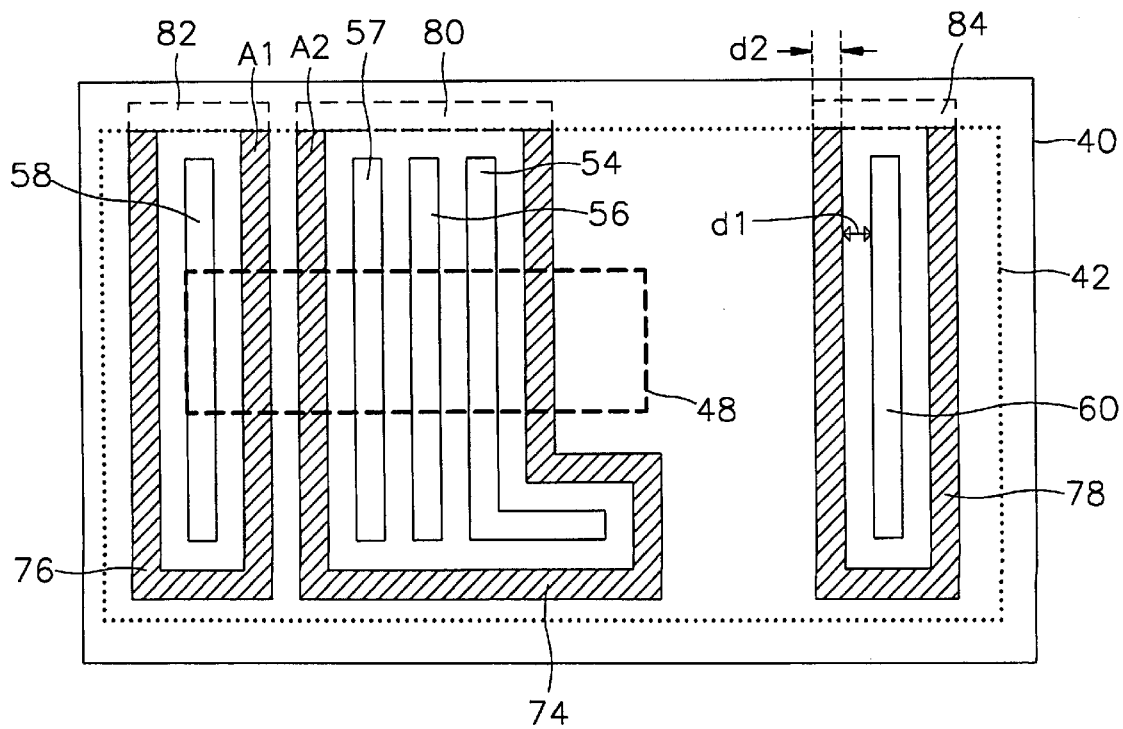

The first through third conductive layer pattern areas are next enlarged a second time. The second enlargement magnitude (d1+d2) is larger than the first magnitude d1. As a result, the sixth area 68 is obtained by the second enlargement of the areas 54, 56, and 57, the seventh area 70 is obtained by the second enlargement of the second area 58 and the eighth area 72 is obtained by the second enlargement of the third area 60. The distance d2 corresponds to the width of the resulting dummy pattern areas 74, 76 and 78 as shown in FIG. 9. Areas outside the dummy pattern boundary area 42 are excluded from any dummy pattern 41. Therefore, it is preferable that the second magnitude d2 is set to be larger than the minimum width d of the conductive layer pattern to prevent pattern lifting during the etching process.

FIG. 9 shows the steps of defining the first through third dummy pattern areas 74, 76, and 78. To be specific, the first dummy pattern area 74 is defined as an area which is obtained by subtracting the third area 62 from the sixth area 68. A second dummy pattern area 76 is defined as an area obtained by subtracting the fourth area 64 from the seventh area 70. A third dummy pattern area 78 is defined as an area which is obtained by subtracting the fifth area 66 from the eighth area 72. As shown in FIG. 9, areas 80, 82 and 84, which are outside the dummy pattern boundary area 42, are not used as portions of dummy pattern areas 74, 76 and 78, respectively.

As described above, the first through third dummy pattern areas 74, 76, and 78 have a width corresponding to the second magnitude d2. These pattern areas are separated, respectively, from the first and third area 54, 56, 57, area 58 and area 60 by a distance corresponding to the first magnitude d1.

Figure 10:
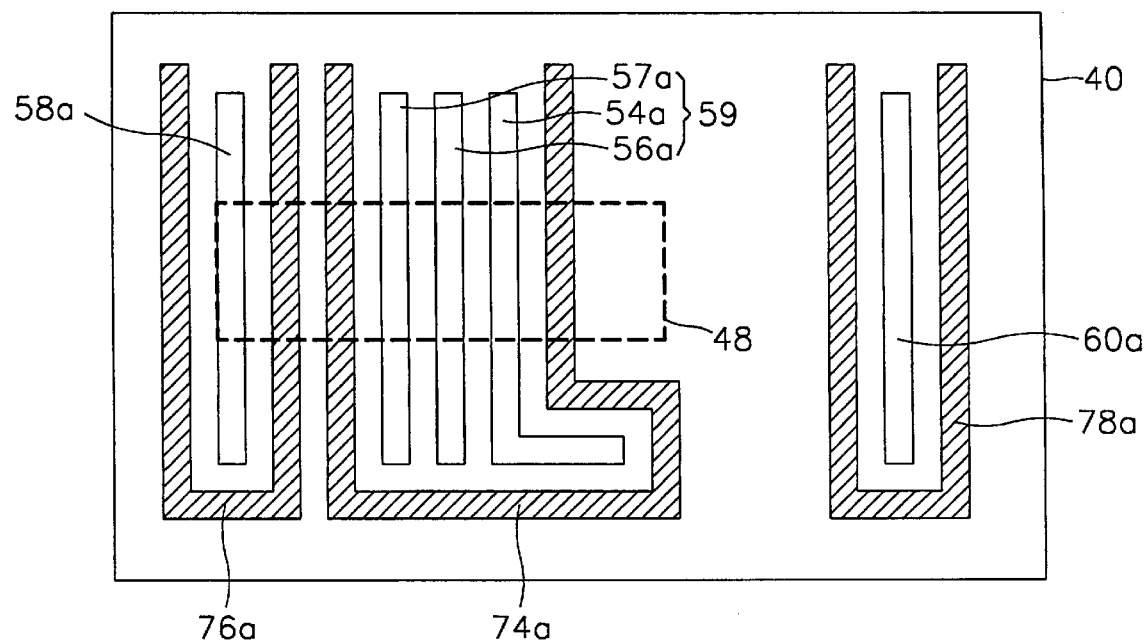

FIG. 10 shows a method for forming the first areas 54a, 56a and 57a, the second and third areas 58a and 60a, and the first through third dummy pattern areas 74a, 76a and 78a. A mask pattern is formed by inputting data corresponding to the first conductive layer pattern areas 54, 56 and 57, the second and third areas 58 and 60, and the first through third dummy pattern areas 74, 76, and 78 to mask making equipment. Using the mask pattern, first through third areas 54a, 56a, 57a, 58a, 60a corresponding to the first through third areas 54, 56, 57, 58, 60, and first through third dummy pattern areas 74a, 76a, 78a, corresponding to the first through third dummy pattern areas 74, 76, 78 are formed on a substrate 40.

Figure 11:
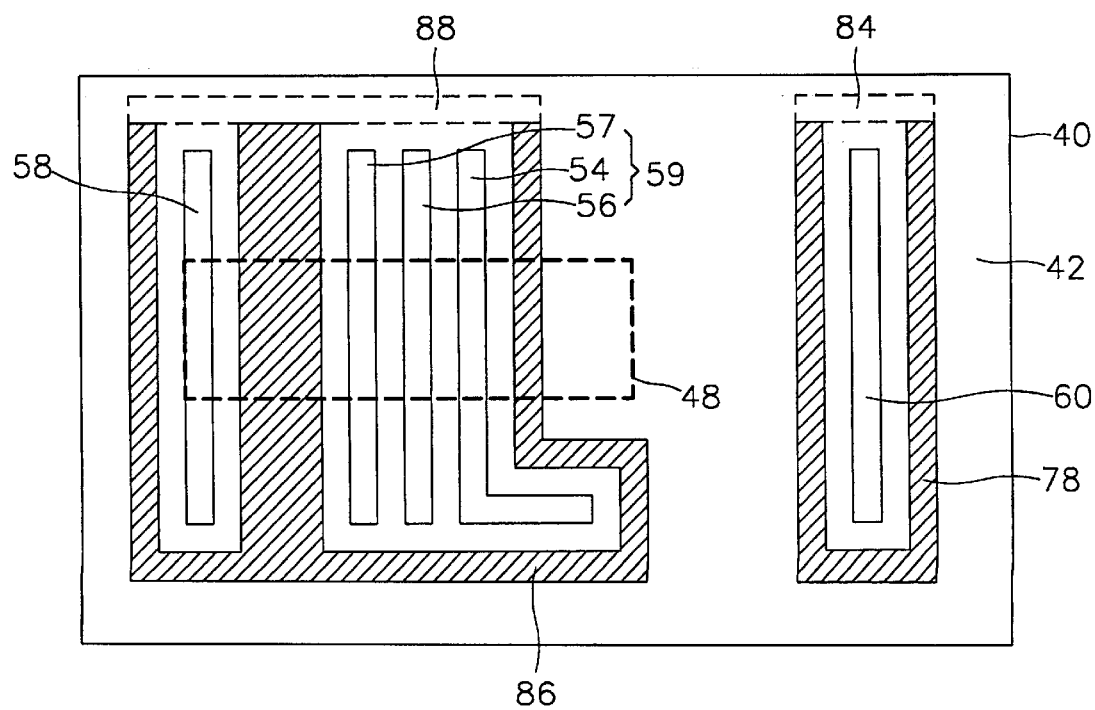
FIGS. 11 and 12 illustrate a method for forming a dummy pattern area in a semiconductor device according to a second embodiment of the present invention.
Figure 12:
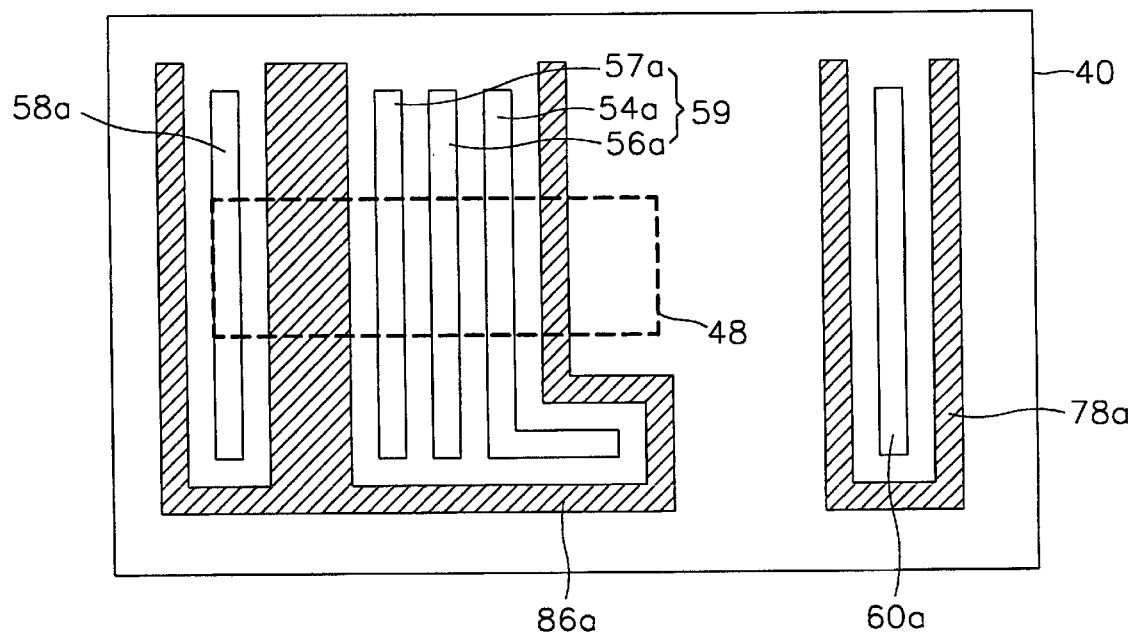

FIGS. 11 and 12 illustrate a method for forming a dummy pattern area of a semiconductor device according to a second embodiment of the present invention. By this method, the narrow spaces between the dummy pattern areas are removed. The same reference numerals are used to designate the elements of the second embodiment that are identical to those of the first embodiment.

In the method for forming the dummy pattern areas 41 according to the second embodiment, the third through eighth areas 62, 64, 66, 68, 70, 72 and the first through third dummy pattern areas 74, 76 and 78 are defined according to the first embodiment described above. Then, as shown in FIG. 9, areas A1 and A2 which are proximate legs of dummy pattern areas 76 and 74, respectively, are combined into one area. The distance by which the first through third dummy pattern areas 74, 76 and 78 are separated from each other is shorter than a predetermined distance. To perform the combination, the respective areas consisting of the first areas 54, 56 and 57 and the second and third areas 58 and 60 are enlarged in a manner similar to the first and second enlargements described above. However, at this time the object of the enlargements is the first through third dummy pattern areas 74, 76 and 78, and not the conductive layer pattern areas 54, 56 and 57. In this case, where the distance by which the first through third dummy pattern areas 74, 76, and 78 are separated from each other is shorter than a predetermined distance are combined and the dummy pattern areas are enlarged as described, the areas A1 and A2 are combined into one area.

Since the enlarged first through third dummy pattern areas 74, 76, and 78 become excessively large through being enlarged, they must be restored to their original size after the combination is completed. For this, the enlarged dummy pattern areas 74, 76 and 78 are reduced. As a result, the first through third dummy pattern areas 74, 76 and 78 are restored to their original size, but the areas A1 and A2 remain combined. The first and second dummy pattern areas 74 and 76 are combined through the areas A1 and A2. Thus, a fourth dummy pattern area 86 of a form different from that of the first through third dummy pattern areas 74, 76 and 78 is defined on the substrate 40 as shown in FIG. 11. The third dummy pattern area 78 is neither enlarged nor reduced since it is far from the first dummy pattern area 74. The area 88 in which the area obtained by the reduction is outside the dummy pattern boundary area 42 is not used in the dummy pattern 86. Then, according to the first embodiment of the present invention, a mask pattern is formed and a conductive layer formed on substrate 40 is patterned using the mask pattern. As shown in FIG. 12, a conductive pattern 59 consisting of the first conductive layer pattern areas 54a, 56a and 57a, the second conductive layer pattern area 58a, the third conductive layer pattern area 60a and the third and fourth dummy pattern areas 78a and 86a are formed on substrate 40.

In the method according to the second embodiment of the present invention, it is possible to remove the narrow spaces between the first through third dummy pattern areas 74, 76 and 78 of FIG. 11 by sequentially enlarging and reducing the first through third dummy pattern areas 74, 76, and 78. Removal of these spaces or gaps provides a flattened surface using this process.

A method for forming a dummy pattern area according to a third embodiment of the present invention is now described with reference to FIG. 13. The same reference numerals are used when elements of the third embodiment of the present invention are identical to those of the first and second embodiments. This also applies to the descriptions herinbelow of methods for forming dummy pattern areas according to fourth and fifth embodiments of the present invention.

Figure 13:
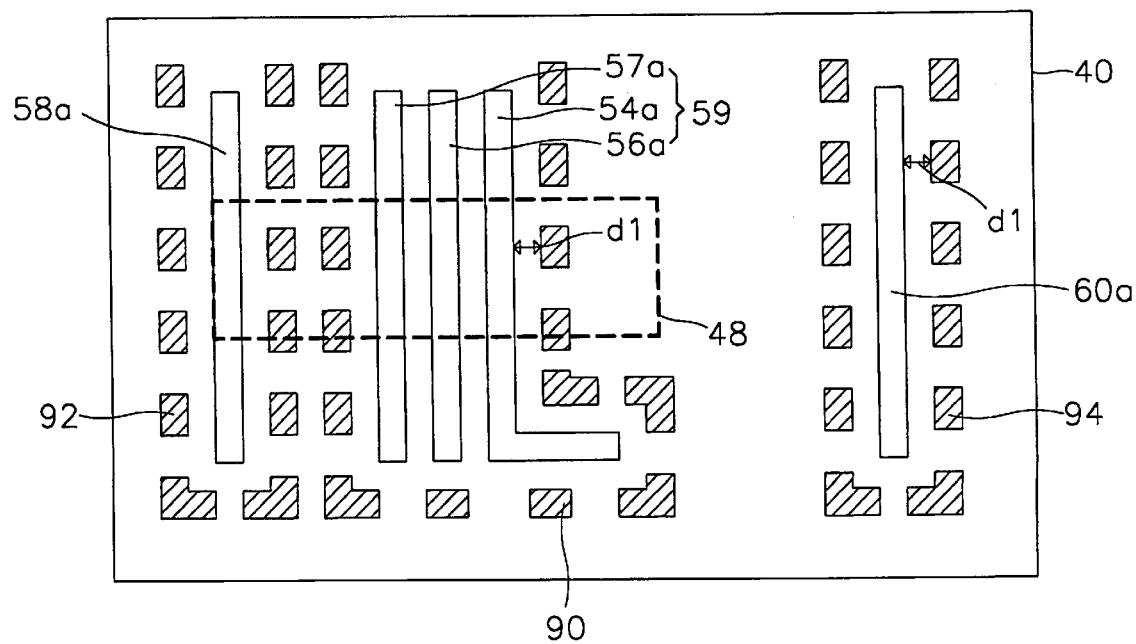
FIG. 13 is a layout diagram including the dummy pattern area formed according to a third embodiment of the present invention.

Referring now to FIG. 13, fifth through seventh dummy pattern areas 90, 92 and 94, formed by the method for forming dummy pattern area 41 according to the third embodiment of the present invention, are formed of a plurality of small dummy pattern elements. This plurality of dummy pattern elements is formed by dividing the first through fourth dummy pattern areas 74a, 76a and 78a of FIG. 10 and 86a of FIG. 12 (formed according to the first and second embodiments) into small dummy pattern areas of predetermined sizes and widths. The dummy pattern area according to the third embodiment can be performed by carrying out one of the following two steps.

In the first step, the first through third dummy pattern areas 74, 76 and 78 of FIG. 9 are each divided into small areas which are separated from each other by a predetermined distance. Next, the fifth through seventh dummy pattern areas 90, 92 and 94 are formed according to the method described above with respect to the first embodiment.

Alternatively, in the second step the third and fourth dummy pattern areas 78a and 86a are each divided into a plurality of small elements separated from each other by a predetermined distance. The dividing is performed after forming the fourth dummy pattern area 86a of FIG. 12 by combining the first and second dummy pattern areas 74a and 76a of FIG. 10 according to the second embodiment above. Further, the dividing of the first through fourth dummy pattern areas 74a, 76a and 78a of FIG. 10 and 86a of FIG. 12 is performed in the steps of defining the first through fourth dummy pattern areas 74, 76 and 78 (FIG. 9) and 86 (FIG. 11) in the substrate 40.

To be specific, the first pattern group area 50 and the second pattern group area 52 are defined, and the first conductive layer pattern areas 54, 56 and 57 and the second area 58 are defined therein. Then, the second area 46 is defined as the third area 60. As mentioned in the method for forming the dummy pattern of the semiconductor device according to the first embodiment, the third through eighth areas 62, 64, 66, 68, 70 and 72 of FIG. 8 are defined by a first and a second enlargement the above areas, sequentially. The first through third dummy pattern areas 74, 76 and 78 of FIG. 9 are defined as areas to overlap the area obtained by subtracting the first enlargement area from the second enlargement area and the dummy pattern boundary area 42. At this time, the distances between the first through third dummy pattern areas 74, 76 and 78 and the width of the first through third dummy pattern areas 74, 76 and 78, respectively, correspond to the first and second magnitudes (d1, d1+d2) of the first embodiment. Then, the first through third dummy pattern areas 74, 76 and 78, are each divided into a plurality of small dummy pattern elements separated from each other by a predetermined distance, using a computer-aided design or CAD tool. A fifth dummy pattern area(not shown) is thus obtained by dividing the first dummy pattern area 74 into a plurality of small dummy pattern elements. A sixth dummy pattern area (not shown) is obtained by dividing the second dummy pattern 76 into a plurality of small dummy pattern elements and a seventh dummy pattern area (not shown) is obtained by dividing the third dummy pattern area 78 into a plurality of small dummy pattern elements. As shown in FIG. 13, using the same processes as those in the method of the first embodiment the first pattern group area 59 formed of the first conductive layer pattern areas 54a, 56a and 57a and the second and third areas 58a and 60a are formed in the substrate 40. Also, the fifth through seventh dummy pattern areas 90, 92, and 94 are formed around the first group area 59 and the second and third areas 58a and 60a. The fifth through the seventh dummy pattern areas 90, 92 and 94 are formed to be separated by a distance equal to the first magnitude d1 from the areas 58a, 59 and 60a. The plurality of small dummy pattern elements consisting of the fifth through seventh dummy pattern areas 90, 92 and 94 each have a width corresponding to the second magnitude (d2).

Though not shown, in the case of forming the dummy pattern area according to the second embodiment, the third and fourth dummy pattern areas 78 and 86 are defined as shown in FIG. 11 according to the method of the third embodiment of the present invention. The third and fourth dummy pattern areas 78 and 86 are then divided into a plurality of small dummy pattern elements using the CAD tool. A seventh dummy pattern area (not shown) is obtained by dividing the third dummy pattern 78 into a plurality of small dummy pattern elements, and an eighth dummy pattern area (not shown) is obtained by dividing the fourth dummy pattern area 86 into a plurality of small dummy pattern elements. Next to be formed by the process of the first embodiment are: the first conductive layer pattern areas 54a, 56a, and 57a consisting of the first pattern group area 59; the second and third areas 58a and 60a; the seventh dummy area pattern 94, and the eighth dummy pattern area. These pattern areas are formed in the areas corresponding, respectively, to the first conductive layer pattern areas 54, 56 and 57, the second and third areas 58 and 60, the seventh dummy pattern and the eighth dummy pattern area of the substrate 40.

As described above, in the method according to the third embodiment, the dummy pattern areas formed by the method of the first or second embodiments are each divided into a plurality of small dummy pattern elements. As a result, the area in which the lower circuit area 48 is overlapped by the fifth through seventh dummy pattern areas 90, 92 and 94 is reduced.

This also reduces the parasitic capacitance between the fifth through seventh dummy pattern areas 90, 92 and 94 and the conductive layer pattern areas formed in the lower circuit area 48 as compared to the dummy pattern area formed according to the first and second embodiments. Therefore, the semiconductor device is less likely to misoperate.

Because the fifth through seventh dummy pattern areas 90, 92, and 94 formed according to the third embodiment are divided into small dummy pattern elements as shown in FIG. 13, the first through third areas 54a, 56a, 58a, and 60a may be more damaged by over-etching as compared to the dummy pattern areas formed according to the first and second embodiments. However, this can be prevented by appropriately controlling the first magnitude d1, the distances between the small dummy pattern areas consisting of the fifth through seventh dummy pattern areas 90, 92 and 94 and the widths of the small dummy pattern elements.

A method for forming a dummy pattern area according to a fourth embodiment of the present invention will now be described. The fourth embodiment provides a method for forming dummy pattern areas which enhances protection of the first through third conductive layer pattern areas 54a, 56a, 57a, 58a and 60a against over-etching.

When forming the first through third dummy pattern areas 74a, 76a, and 78a in the substrate 40 according to the first embodiment, it is possible to minimize formation of parasitic capacitors between the conductive layer pattern areas formed in the lower circuit area 48 and the first through third dummy pattern areas 74a, 76a, and 78a. However, it is difficult to completely prevent the first pattern group area 59 and the second and third areas 58a and 60a from being damaged during patterning of these areas and the first through third dummy pattern areas 74a, 76a, and during a CMP process. The method for forming the dummy pattern area according to the fourth embodiment provides a solution for this problem by forming more dummy pattern areas around those dummy pattern areas which are vulnerable during over-etching.

Figure 15:
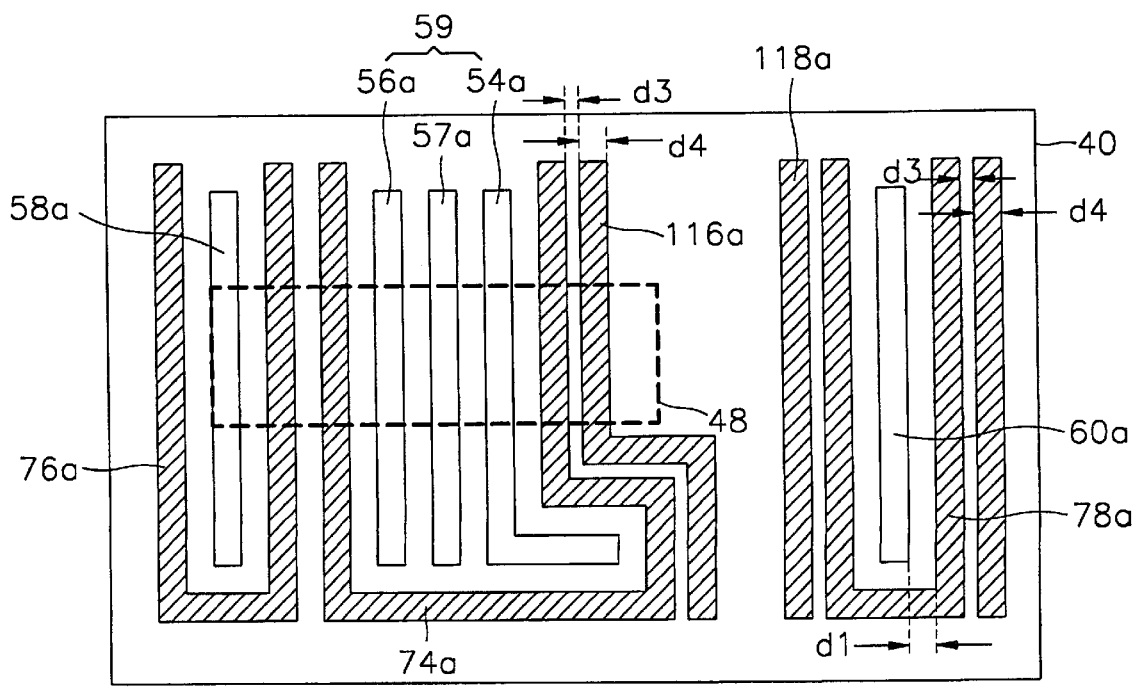

For example, referring to FIG. 15, the first conductive layer pattern group area 59 and the third area 60a are respectively formed so as to be separated from the first dummy pattern area 74a and the third dummy pattern area and during a CMP process by the first magnitude d1. Also, the second area 58a is separated from the second dummy pattern area 76a by a distance equal to the first magnitude d1. As a result, the first and second dummy pattern areas 74a and 76a are formed on the substrate between the first pattern group area 59 and the second area 58a. Therefore, an area of the substrate 40 between the first pattern group area 59 and the second 58a is less vulnerable to over-etching than other areas.

The first dummy pattern area 74a and the third dummy pattern area 78a are formed between the first pattern group area 59 and the third conductive layer pattern area 60a on the substrate 40. However, the distance between the first pattern group area 59 and the third area 60a is much greater than the distance between the first pattern group area 59 and the second 58a. Accordingly, with regard to the first and third dummy pattern areas 74a and 78a vulnerability to over-etching exists. In other words, among the first areas 54a, 56a and 57a consisting of the first pattern group area 59, the pattern area close to the center of the substrate 40 and the third area 60a may still be damaged during the over-etching compared to other pattern areas. Thus, ninth and tenth dummy pattern areas 116a and 118a are respectively formed at the right side of the first pattern group area 59 and both sides of the third area 60a. The ninth and tenth dummy pattern areas 116a and 118a are formed to be separated from the first dummy pattern 74a and the third dummy pattern 78a, respectively, by a distance equal to a third magnitude d3 and have a width corresponding to a fourth magnitude d4. The third and fourth magnitudes (d3 and d4) can be controlled. The ninth and tenth dummy pattern areas 116a and 118a are formed by the same method as that for forming the first through seventh dummy pattern areas 74a, 76a and 78a of FIG. 10, pattern area 86a of FIG. 12, and pattern areas 90, 92 and 94 of FIG. 13.

To be specific, the first and second conductive layer pattern areas 44 and 46 are defined on the substrate 40 and the first pattern group area 50 and the second pattern group area 52 are defined in the first area 44 according to the first embodiment. The third through eighth areas 62, 64, 66, 68, 70 and 72 are defined, respectively, by the first and second enlargements of the first conductive layer pattern areas 54, 56 and 57 (comprising the first pattern group area 50) and the second and third pattern areas 58 and 60.

Figure 14:
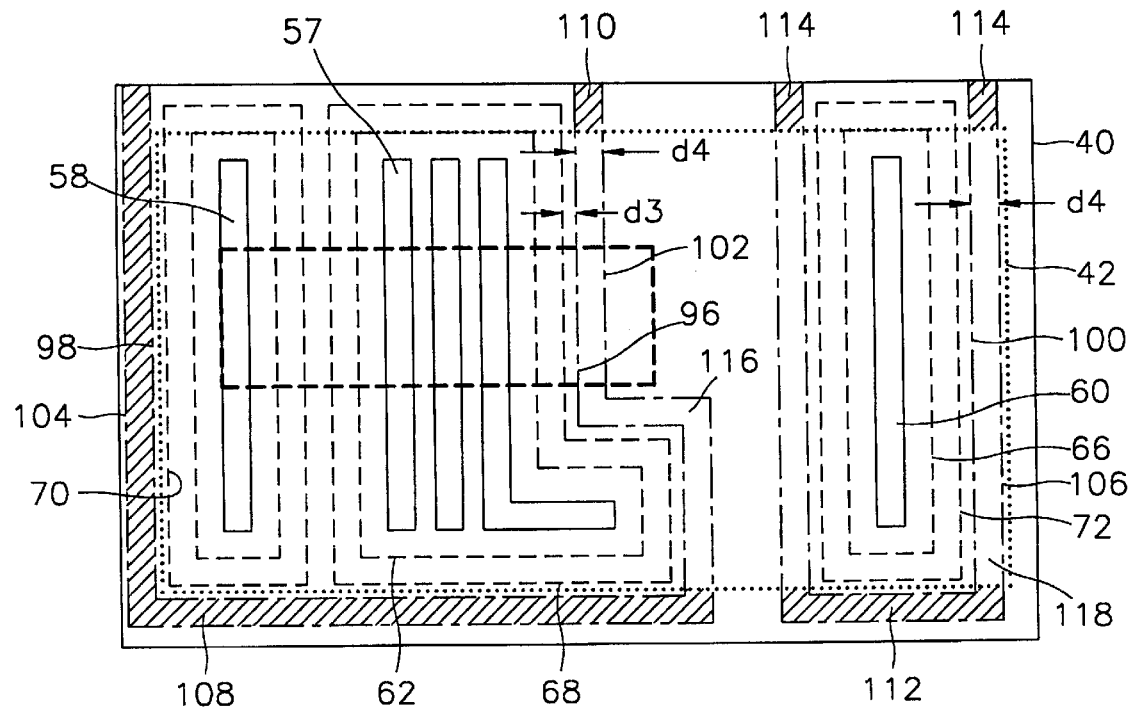
FIGS. 14 and 15 illustrate a method for forming a dummy pattern area of a semiconductor device according to a fourth embodiment of the present invention.

Referring now to FIG. 14, the first areas 54, 56 and 57 and the second and third areas 58 and 60 are subjected to a third and a fourth enlargement. The third and fourth enlargements are performed in the same manner as the first and second enlargements. By means of the third and fourth enlargements, the first areas 54, 56 and 57 and the second and third areas 58 and 60 are progressively enlarged. A ninth area 96 is obtained by the third enlargement of the first areas 54, 56 and 57. A tenth area 98 is obtained by the third enlargement if the second area 58 and an eleventh area 100 is obtained by the third enlargement of the third area 60. The ninth through eleventh areas 96, 98 and 100 are enlarged to be larger than the sixth through eighth areas 68, 70 and 72, respectively, by the third magnitude d3.

A twelfth area 102, a thirteenth area 104, and a fourteenth area 106 are defined by the fourth enlargement of the first areas 54, 56, and 57 and the second and third areas 58 and 60. The twelfth through fourteenth areas 102, 104 and 106 are formed to be larger than the ninth through eleventh areas 96, 98, and 100, respectively, by the fourth magnitude d4.

As the width of the first through third dummy pattern areas 74a, 76a and 78a is determined in the first embodiment, the ninth through eleventh areas 96, 98 and 100 are respectively subtracted from the twelfth through fourteenth areas 102, 104 and 106. The areas outside of dummy pattern boundary area 42 are not used, for example, areas 108, 110, 112 and 114 as shown in FIG. 14. As a result, the ninth and tenth dummy pattern areas 116 and 118 are defined on the substrate 40. Those areas outside the dummy pattern boundary area 42 are ignored. In this way, the width of the ninth and tenth dummy pattern areas 116 and 118 is determined. Accordingly, referring to FIG. 15, the width of the ninth and tenth dummy pattern areas 116a and 118a, the distances between the ninth and tenth dummy pattern areas 116a and 118a and the first and third dummy pattern areas 74a and 78a, are determined. It is therefore possible to control the width of the ninth and tenth dummy pattern areas 116 and 118, the distance by which the ninth and tenth dummy pattern areas 116 and 118 are separated from the first and third dummy pattern areas 74 and 78, and the third and fourth magnitudes d3 and d4 by controlling the third and fourth enlargements. The difference between the third and fourth enlargements is determined according to the above guideline for determining the difference between the first and second enlargements.

The ninth and tenth dummy pattern areas 116 and 118 are thus defined at the right side of the first dummy pattern area 74 of FIG. 9 and both sides of the third dummy pattern area 78 of FIG. 9. This is because the areas enlarged by the third and fourth enlargements do not overlap each other. This in turn results from the first pattern group area 50 being separated from the third conductive layer pattern area 60 by a much greater distance than the distance between the first areas 54, 56 and 57 (first pattern group area 59).

The second area 58 is closer to the first pattern group area 59 than to the third conductive layer pattern area 60. Therefore, the areas obtained by the third and fourth enlargements increase in size by more than twice the distance between the second area 58 and the first pattern group area 59, and thus are combined into one area. But, since this area is outside the dummy pattern boundary area 42, the area is ignored and does not form a part of the dummy pattern area.

After further defining the ninth and tenth dummy pattern areas 116 and 118 in the substrate 40, the processes used in the method according to the first embodiment are performed. This forms the first pattern group area 59, the second and third areas 58a and 60a, the first through third dummy pattern areas 74a, 76a and 78a and the ninth and tenth dummy pattern areas 116a and 118a on substrate 40 as shown in FIG. 15. The ninth and tenth dummy pattern areas 116a and 118a are separated from the first through third dummy pattern areas 74a, 76a and 78a by a distance equal to the third magnitude d3.

In the method for forming the dummy pattern area according to the fourth embodiment of the present invention, it is possible to prevent the conductive layer pattern from being damaged during over-etching by forming double dummy pattern areas in the portions of the substrate 40 that are vulnerable to over-etching. Though the vulnerable portions of the conductive layer pattern for the over-etching are local, it is possible to selectively form double dummy pattern areas only in the vulnerable portions by controlling the dummy pattern boundary area 42 in the process of defining the ninth and tenth dummy pattern areas 116 and 118. Therefore, it is possible to reduce formation of the parasitic capacitors between the lower circuit area 48 and the dummy pattern 41, or between the dummy pattern 41 and the adjacent conductive layer pattern. It is also possible to form only one of the ninth or tenth dummy pattern areas 116a, 118a in the substrate 40. For example, by controlling the third and fourth enlargements in the fourth embodiment only the ninth dummy pattern 116a is formed.

Figure 16:
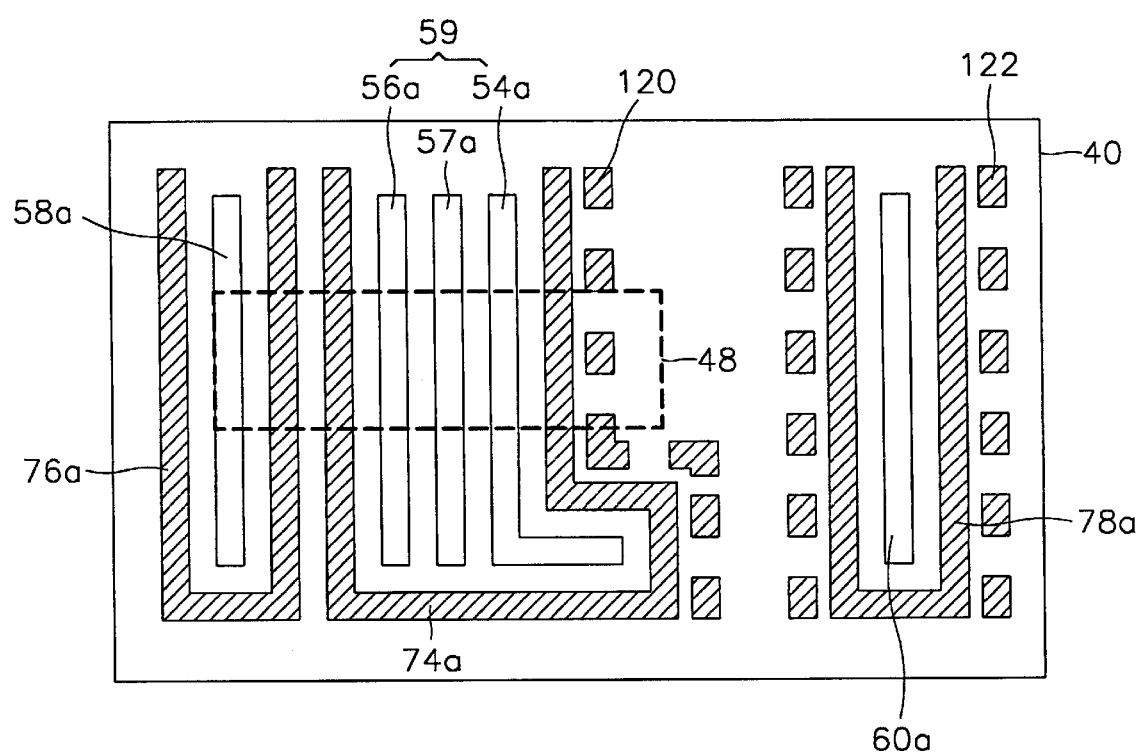
FIG. 16 is a layout diagram including the dummy pattern area formed according to a fifth embodiment of the present invention.

A method for forming a dummy pattern in a semiconductor device according to a fifth embodiment of the present invention will now be descried in detail with reference to FIG. 16. In this embodiment, the first through fourth embodiments are combined.

In the fifth embodiment, certain of the dummy pattern areas 41 formed in substrate 40 are formed according to the first or second embodiments, and others are formed according to the third or fourth embodiments. Referring to FIG. 16, the first through third dummy pattern areas 74a, 76a and 78a are formed according to the first embodiment. Eleventh and twelfth dummy pattern areas 120 and 122 are formed in a position separated from the first dummy pattern 74a and the third dummy pattern 78a according to the third and fourth embodiments. At this time, the position of the eleventh and twelfth dummy pattern areas 120 and 122 in the substrate 40 is selected according to the fourth embodiment. Forming the eleventh and twelfth dummy pattern areas 120 and 122 is the same as forming a plurality of small dummy pattern elements in the position of the ninth and tenth dummy pattern areas (116a and 118a of FIG. 15).

The method for forming the eleventh and twelfth dummy pattern areas 120 and 122 together with the first through third dummy pattern areas 74a, 76a and 78a is described in detail in the description of the first, third and fourth embodiments.

According to the teaching of the present invention, other embodiments are possible. For example, the methods for forming the dummy pattern areas according to the third and fourth embodiments may be combined. In such an embodiment, at least one dummy pattern area selected from the dummy pattern area group consisting of the first through third dummy pattern areas 74a, 76a and 78a and the ninth and tenth dummy pattern areas 116a and 118a, as shown in FIG. 15, is divided into a plurality of small dummy pattern elements.

According to this combined embodiment, the first and second dummy pattern areas 74a and 76a are divided into a plurality of small dummy pattern elements while the third dummy pattern 78a is left whole. The second embodiment is applied to the resultant structure. As a result, it is possible to prevent gaps or spaces between the dummy pattern areas by combining the portions where the distance between the divided pattern areas of the first and second dummy pattern areas 74a and 76a is less than a predetermined distance.

Also, a method for forming the dummy pattern area is possible in which the third and fourth embodiments are combined. For example, the first through third dummy pattern areas 74, 76 and 78 are defined in the substrate 40 according to the first embodiment. Then the ninth and tenth dummy pattern areas 116, 118 are defined on the right side of the first dummy pattern area 74 and on both sides of the third dummy pattern area 78 according to the fourth embodiment. Next, the first and second dummy pattern areas 74 and 76, the third conductive layer pattern area 60 and the first through third dummy pattern areas 74, 76 and 78 are divided into a plurality of small dummy pattern elements using a CAD tool according to the third embodiment, leaving the ninth and tenth dummy pattern areas 116, 118 whole. These areas are then formed on substrate 40 as dummy pattern areas 116a and 118a and a plurality of small dummy pattern elements.

In another embodiment of the present invention, the first through third dummy pattern areas 74a, 76a and 78a are formed together with the ninth and tenth dummy pattern areas 116a and 118a. But, the first and second dummy pattern areas 74a and 76a and the ninth dummy pattern 116a are not divided and the third dummy pattern 78a and the tenth dummy pattern 118a are each divided into a plurality of small dummy pattern elements. In this manner, the portions where the distance between the divided small dummy pattern elements is less than a predetermined distance can be combined according to the method of the second embodiment.

In the method for forming dummy pattern areas according to the present invention, the dummy pattern areas are formed only in certain portions of the area 47 in which the conductive layer pattern areas on the substrate 40 are not formed. It is possible to control the width of the dummy pattern areas 41 and the distance by which the dummy pattern areas are separated from the conductive layer pattern areas by controlling the degree of enlargement of the conductive layer pattern areas 55 during the process of defining the dummy pattern areas on substrate 40. Also, it is possible to prevent gaps or spaces from existing between the dummy pattern area 41 by combining the dummy pattern area 41 in the portions where the distance between the dummy pattern areas is excessively narrow. Accordingly, it is possible to reduce damage to the conductive layer pattern areas 55 during over-etching and reduce formation of parasitic capacitors between the lower circuit area 48 and dummy pattern areas 41. Since leakage current is reduced, the possibility of misoperation of the semiconductor device is also reduced.

The present invention is not restricted to the above embodiments and many variations within the spirit and scope of the present invention are possible by those skilled in the art.

What is claimed is:

1. A method for forming a dummy pattern for a semiconductor device, comprising the steps of:
   (a) defining a dummy pattern boundary area on a substrate;
   (b) defining a first area and a second area within the dummy pattern boundary area, wherein the second area is defined to be separated from the first area by a first distance;
   (c) defining a first conductive layer pattern area and a second conductive layer pattern area separated from each other by a second distance within the first area, and defining a third conductive layer pattern area in the second area;
   (d) defining first, second, and third dummy pattern areas, each having a width and being separated by a distance of a first magnitude around said first and second conductive layer pattern areas and the third conductive layer pattern area, each said dummy pattern area extending, respectively, around one of said first conductive layer pattern area, said second conductive layer pattern area, and said third conductive layer pattern area so that said third conductive layer pattern area is separated from said first conductive layer pattern area by said first and third dummy pattern areas, and so that said third conductive layer pattern area is separated from said second conductive layer pattern area by said second and third dummy pattern areas wherein said first and second dummy pattern areas are spaced apart from said third dummy pattern area by a greater distance than said first dummy pattern area is spaced apart from said second dummy pattern area, wherein the step (d) further comprises the steps of,
   (d1) enlarging the first pattern group area, the second pattern group area, and the third conductive layer pattern area by a first magnitude respectively, thereby defining third through fifth areas,
   (d2) enlarging the first pattern group area, the second pattern group area, and the third conductive layer pattern area by a second magnitude respectively, thereby defining sixth through eighth areas, and
   (d3) defining first through third dummy pattern areas as areas which are obtained by subtracting the third through fifth areas from the sixth through eighth areas respectively, and by subtracting areas which are outside the dummy pattern boundary area; and
   (e) forming first through third conductive layer patterns on the substrate in said first conductive layer pattern area, said second conductive layer pattern area and said third conductive layer pattern area respectively.

2. The method of claim 1, wherein when defining the third through fifth areas, portions where the distance between the enlarged areas is less that one-half of the first magnitude are combined, and when defining the sixth through eighth areas, portions where the distance between the enlarged areas is less than one-half of a minimum width between the conductive layer pattern areas is combined.

3. The method of claim 2, wherein adjacent areas of said dummy pattern areas are combined where the distance between the dummy pattern areas is less than one-half of the second magnitude.

4. The method of claim 3, wherein the difference between the first magnitude and the second magnitude is about a minimum width between conductive layers.

5. The method of claim 2, wherein the first magnitude is about 1.5 to 2 times a minimum distance between conductive layers.

6. The method of claim 1, further comprising the step of defining a fourth dummy pattern area by combining portions of the first and second dummy pattern areas and forming on the substrate a fourth dummy pattern corresponding to the fourth dummy pattern area.

7. The method of claim 6, wherein the fourth dummy pattern area is defined by combining the portions where the distance between the first and second dummy pattern is less than a distance by enlarging and then reducing the first through third dummy patterns.

8. The method of claim 1, wherein one pattern among the first through third dummy pattern areas is formed of a plurality of smaller dummy elements.

9. The method of claim 1, wherein further dummy pattern areas, separated from the first through third dummy pattern areas by a third distance respectively, are defined in a side or both sides of the first through third dummy pattern areas, and said further other dummy pattern areas corresponding to the other dummy pattern areas are formed on the substrate.

10. The method of claim 9, wherein one pattern from said further dummy pattern areas is formed of a plurality of smaller dummy pattern elements and said smaller dummy pattern elements correspond to smaller dummy pattern areas formed on the substrate.

11. The method of claim 10, wherein the portions where the distance between the small dummy pattern areas is less than a distance are combined by enlarging and then reducing a defined plurality of smaller dummy pattern areas.

* * * * *